Nov. 23, 1965 A. G. UPDIKE 3,219,945

VOLTAGE CONTROLLED VARIABLE FREQUENCY RELAXATION OSCILLATOR

Filed April 22, 1963 2 Sheets-Sheet 1

ABNER G. UPDIKE
INVENTOR.

BY Nathan N. Kallman

ATTORNEY

Nov. 23, 1965 A. G. UPDIKE 3,219,945

VOLTAGE CONTROLLED VARIABLE FREQUENCY RELAXATION OSCILLATOR

Filed April 22, 1963 2 Sheets-Sheet 2

ABNER G. UPDIKE
INVENTOR.

BY Nathan N. Kallman

ATTORNEY

United States Patent Office 3,219,945
Patented Nov. 23, 1965

3,219,945

VOLTAGE CONTROLLED VARIABLE FREQUENCY RELAXATION OSCILLATOR

Abner G. Updike, Menlo Park, Calif., assignor to Ampex Corporation, Redwood City, Calif., a corporation of California Filed Apr. 22, 1963, Ser. No. 274,655
2 Claims. (Cl. 331—111)

This invention relates generally to a variable frequency oscillator and particularly to an oscillator whose output frequency can be varied in proportion to amplitude variations of an applied input signal.

Although a multitude of variable frequency oscillators are known in the prior art which function to permit the selective generation of signals of different frequencies, most all of such oscillators are generally deficient in one or more respects where it is desired to vary the output frequency in proportion to changes in amplitude of an input current or voltage signal.

Often, the range over which the frequency of the oscillator output signal can be varied linearly with respect to variations in the amplitude of an input signal is extremely limited. Moreover, in oscillators of this type, in order to change the operating range, it is usually necessary to change a great number of circuit components. Those oscillators in which the operating range is not excessively limited usually employ an excessive number of interdependent components, which of course results in the performance of the oscillator being somewhat unpredictable. Further, most prior art variable frequency oscillators employ balanced circuits and therefore often fail to start oscillating when power is applied because current is initiated in both circuit halves. As a consequence, these balanced oscillator circuits are generally provided with means to assure starting, this additional means of course adding to the complexity and cost of the oscillator.

In view of the recognized deficiencies of prior art variable frequency oscillators, it is an object of this invention to provide an improved variable oscillator which is simpler in construction and consequently less expensive and more reliable than heretofore known oscillators.

It is a further object of this invention to provide an improved oscillator whose output frequency can be accurately and linearly varied over a relatively wide range as a function of the amplitude of an applied input signal.

It is a further object of this invention to provide a variable frequency oscillator which is self-starting and consequently does not require the provision of special means to assure starting.

Briefly, the invention herein is directed to a means for varying the frequency of an output signal in proportion to amplitude changes of an input signal, by utilizing the input signal to vary the charging current to an energy storage device; and developing said output signal from a threshold discharge device capable of discharging said storage device each time the energy stored therein exceeds a threshold level established by said threshold discharge device.

In a preferred embodiment of the invention, a capacitor is connected in series with the emitter-collector path of a transistor. The transistor is connected in a difference amplifier circuit which assures that charging current in the emitter-collector path of the transistor remains substantially constant in the absence of variations in the amplitude of a voltage input signal applied to the difference amplifier. In response to variations in the applied input signal, the charging current will vary linearly with respect to such variations. A threshold discharge device including complementary first and second regeneratively coupled transistors is connected to the capacitor and functions to discharge the capacitor whenever the voltage across it exceeds a first predetermined threshold level. When the voltage across the capacitor falls below a second predetermined threshold level, the discharging terminates and the charging of the capacitor is again initiated.

One of the significant features of the invention is its ability to change operating frequency ranges in response to the changing of only one circuit component, that is the capacitor or a reference voltage source. An additional feature of the invention is that it utilizes very few components which are interdependent and as a consequence, performance of the invention is predictable within a relatively small tolerance.

A further feature of the invention constitutes the provision of an improved threshold discharge device which employs regenerative techniques to assure extremely fast response times.

An additional feature of the invention is the utilization of an unsymmetrical circuit which thereby assures that the circuit will always start to oscillate when power is applied inasmuch as oscillation does not depend upon alternate conduction within respective halves of the circuit, as is typical of most prior art oscillators.

The novel features that are considered characteristic of this invention are set forth with particularity in the appended claims. The invention itself both as to its organization and method of operation, as well as additional objects and advantages thereof, will best be understood when read in connection with the accompanying drawings, in which:

Figures 1, 2:
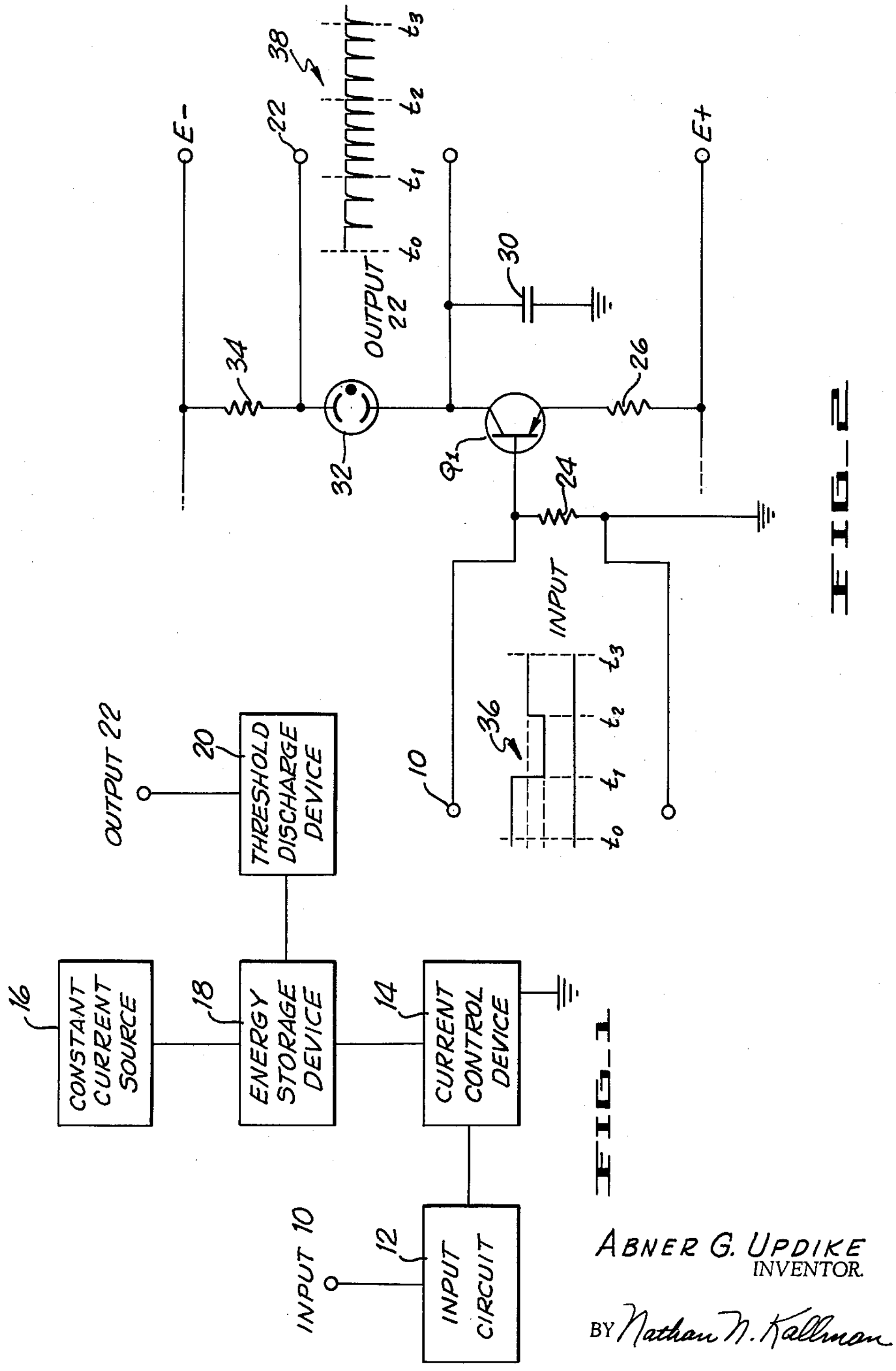
FIGURE 1 is a block diagram illustrating the basic concepts of the invention.
FIGURE 2 is a circuit diagram illustrating a first embodiment of the invention.

Attention is now called to FIGURE 1 which illustrates a block diagram of the invention. An amplitude varying signal is applied to input terminal 10, which in turn is connected to an input circuit 12. The input circuit 12 is in turn connected to a current control device 14, which is connected in a series circuit including a constant current source 16, and an energy storage device 18. A threshold discharge device 20, is connected between the energy storage device 18 and an output terminal 22.

Basically, the invention operates by permitting current from the source 16 to charge the storage device 18 under the control of the device 14. When the energy storage level in the storage device 18 exceeds a certain threshold level established by the threshold discharge device 20, the threshold discharge device, which performs the function of a switch, closes to thereby discharge the energy from the storage device 18. The discharging of the storage device 18, is of course reflected at the output terminal 22. When the stored energy level in device 18 falls below a second threshold level, the threshold discharge device 20 opens, to thereby permit the storage device 18 to again be charged.

The input circuit 12 is responsive to amplitude variations in the input signal applied to terminal 10 for effectively controlling the device 14 to linearly vary the current through the energy storage device 18. In the absence of an amplitude variation of the input signal, the charging current applied to the energy storage device 18 remains substantially constant. As a consequence, the frequency of the output signal available at the output terminal 22 will vary linearly with respect to the amplitude of the input signal inasmuch as the charging current entering the energy storage device 18 will vary linearly with the input signal and the frequency of the output signal will in turn vary linearly with respect to the rate at which energy is stored in the device 18.

Attention is now called to a first embodiment of the invention illustrated in FIGURE 2. Therein, the input terminal 10 is connected to the base of a PNP transistor $Q_1$ and through a resistor 24 to ground. The emitter of transistor $Q_1$ is connected through resistor 26 to a positive potential source (E+). The collector of transistor $Q_1$ is connected through capacitor 30 to ground. Additionally, the collector of transistor $Q_1$ is connected to a first electrode of a neon tube 32, the second electrode of the neon tube being connected through a resistor 34, to a source of negative potential (E−). The output terminal 22 is connected to the junction between the resistor 34 and the second electrode of neon tube 32.

It should be appreciated that the circuit of FIGURE 2 is a specific embodiment of the block diagram of FIGURE 1. More particularly, the resistor 24 constitutes the input circuit 12 while the transistor $Q_1$ can be considered as the current control device 14 which functions both to assure a constant current in its emitter-collector path in the absence of a variation in the amplitude of the signal applied to input terminal 10, and which in addition functions to vary the current in its emitter-collector path linearly in proportion to changes in the amplitude of the signal applied to input terminal 10. The capacitor 30 of course constitutes the energy storage device 18 while the neon tube 32 constitutes the threshold discharge device 20.

In the operation of the circuit of FIGURE 2, let it be initially assumed that the illustrated input signal 36 is applied to input terminal 10. At time $t_0$, the amplitude of the input signal 36 is at a first level and a corresponding first current level is established in the emitter-collector path of transistor $Q_1$, which functions to charge capacitor 30 at a first rate. The charging current through the emitter-collector path of transistor $Q_1$ will charge the capacitor 30 and build up voltage thereacross. As a consequence, of course voltage will be built up across the neon tube 32. At a first threshold level, the neon tube 32 will break down and thus permit the capacitor 30 to discharge therethrough. Discharge current through the neon tube 32 will of course be reflected at the output terminal 22 of the circuit inasmuch as the potential on the output terminal 22 will increase in response to the voltage drop across the resistor 34.

Since the neon tube 32 will break down each time the voltage across the capacitor 30 builds up to the first threshold level, a series of output pulses will be provided at output terminal 22, all of whose amplitudes are equal. Note that when the amplitude of the input signal 36 is at the first level, as between time $t_0$ and time $t_1$, three pulses will be provided at the output terminal 22. At time $t_1$ the amplitude of the input signal 36 falls to a second level, and the current through the emitter-collector path of transistor $Q_1$ is increased to thereby increase the rate at which the capacitor 30 charges. As a consequence, the neon tube 32 will break down more often and thereby increase the frequency of the signal available at the output terminal 22. This is to be seen in the illustration of the output signal 38 wherein between times $t_1$ and $t_2$, five output pulses are generated. At time $t_2$, when the amplitude of the input signal 36 changes to a third level, intermediate the first and second levels, the current in the emitter-collector path of transistor $Q_1$ will be decreased and the rate at which the capacitor 30 charges will be decreased. Consequently, the neon tube 32 will break down at a rate intermediate that at which it broke down when the input signal resided at the first and second levels and accordingly, four pulses will be provided at the output terminal 22 in the interval between $t_2$ and $t_3$.

By properly choosing the transistor $Q_1$ and other circuit components, it can be assured that the emitter-collector current will remain constant, so long as the amplitude of the input signal remains constant, and be independent of the voltage built up across the capacitor 30. It is pointed out that the neon tube 32 represents only one form of threshold discharge device which could be utilized to discharge the capacitor 30 when the voltage across the capacitor 30 exceeds a predetermined level. The frequency of oscillation of the output signal is determined solely by the collector current or charging current, the quantitative value of the capacitor 30, and the upper and lower threshold levels of the threshold device or neon tube 32.

Figure 3:
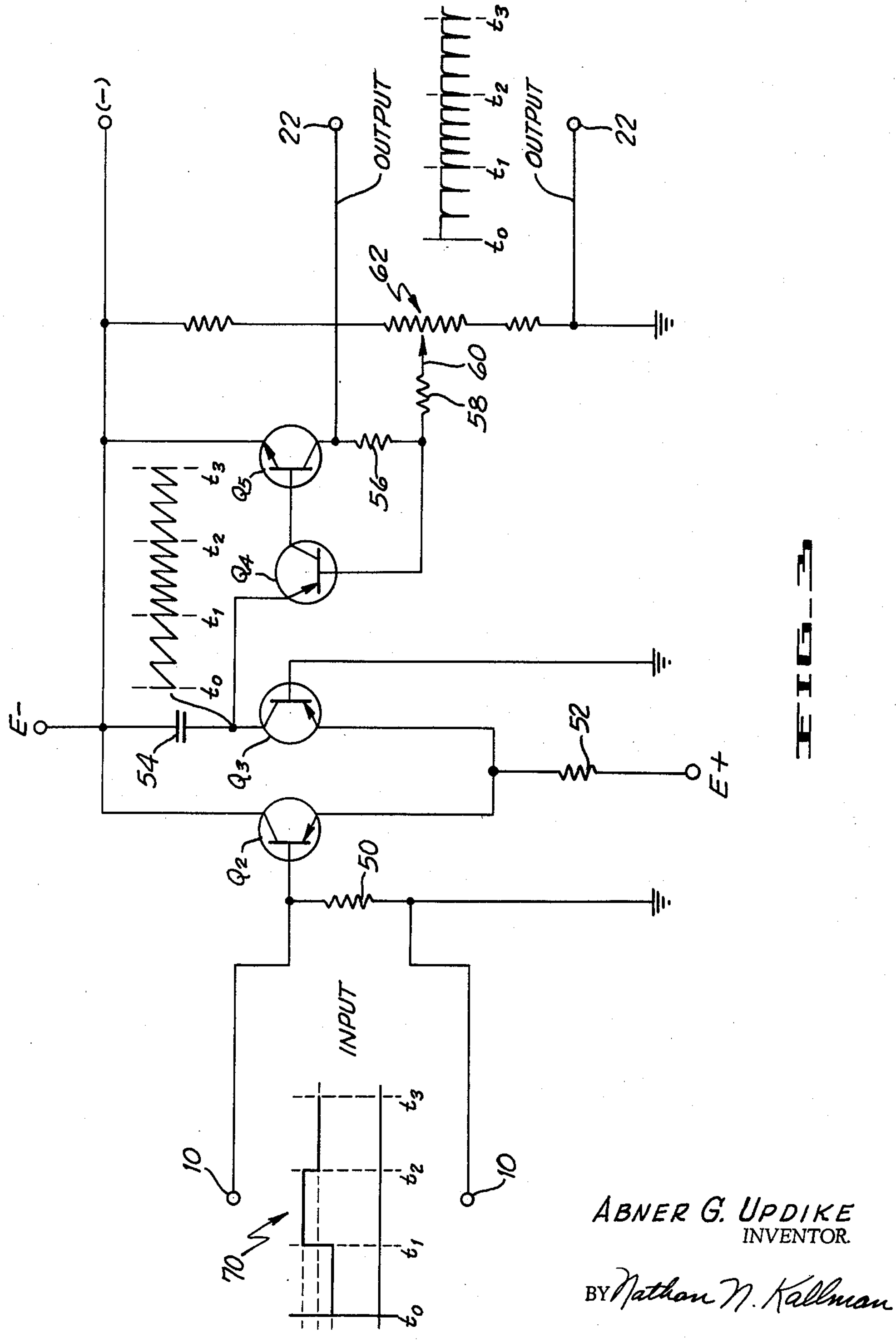
FIGURE 3 is a circuit diagram illustrating a second and preferred embodiment of the invention.

Attention is now called to FIGURE 3 wherein a preferred embodiment of the invention is illustrated. In this embodiment, the input terminal 10 is connected to the base of a PNP transistor $Q_2$ and through a resistor 50 to ground. The emitter of the transistor $Q_2$ is connected through a resistor 52 to a positive potential source (E+). The collector of the transistor $Q_2$ is connected to a negative potential source (E−). A second PNP transistor $Q_3$ is provided and has its emitter connected to the emitter of transistor $Q_2$ and its collector connected through a capacitor 54 to the negative potential source (E−). The base of transistor $Q_3$ is connected to ground.

An additional PNP transistor $Q_4$ is provided and has its emitter connected to the collector of transistor $Q_3$ and its collector connected to the base of an NPN transistor $Q_5$. The emitter of transistor $Q_5$ is connected to the negative potential source (E−). The collector of transistor $Q_5$ is connected through a resistor 56 to the base of transistor $Q_4$. The base of transistor $Q_4$ is connected through resistor 58 to a movable tap 60 on a resistive voltage divider 62. The voltage divider 62 is connected between the negative potential source (E−) and ground. The output terminal 22 is connected to the collector of transistor $Q_5$.

In accordance with the block diagram of FIGURE 1 the resistor 50 of FIGURE 3 can be considered as the input circuit and the transistor $Q_2$ as the current control device while the transistor $Q_3$ and potential sources can be considered as the constant current source 16. The capacitor 54 of course is analogous to the energy storage device 18 while the transistors $Q_4$ and $Q_5$ and interconnecting circuitry constitute the threshold discharge device 20.

In order to understand the operation of the embodiment of FIGURE 3, let it be assumed that the input signal 70 is applied to the input terminal 10. At times $t_0$, the amplitude of input signal 70 is at a first level and causes current conduction through the emitter-collector path of transistor $Q_2$. Consequently, a certain voltage level is established on the emitter of transistor $Q_3$ which drives current through the emitter-collector path of transistor $Q_3$ and charges the capacitor 54. At time $t_1$ when the amplitude of the input signal 70 rises to a second level, the current conducted through the emitter-collector path of transistor $Q_2$ is reduced and as a consequence the emitter potential of transistor $Q_3$ is increased to thereby increase the charging current delivered to capacitor 54. At time $t_2$ when the amplitude of the input signal 70 falls to a third level, intermediate the first and second levels, the current through the emitter-collector path of transistor $Q_2$ increases and (as a consequence) the potential of the emitter of transistor $Q_3$ decreases to thereby reduce the charging current flowing into capacitor 54.

The transistors $Q_2$ and $Q_3$ together can be considered as a difference amplifier with the potential difference between the signal applied to the base of transistor $Q_2$ and the signal applied to the base of transistor $Q_3$ determining how the current flowing through resistor 52 divides between the emitter-collector path of the transistors $Q_2$ and $Q_3$. The utilization of the difference amplifier arrangement as illustrated, assures that the emitter-collector current driven through transistor $Q_3$ is proportional to the level of the input signal applied to the base of transistor $Q_2$.

As previously noted, proper choice of transistor $Q_3$ will assure that an extremely high collector resistance is provided to thereby render the emitter-collector current of transistor $Q_3$ substantially immune to changes in collector voltage.

As previously pointed out, the base of transistor $Q_4$ is connected to a reference voltage established by the position of the tap 60 on the voltage divider 62. As long as the voltage across the capacitor 54 is less than the voltage drop across the resistances connected between the base of transistor $Q_4$ and the negative potential source (E−), the emitter-base junction of the transistor $Q_4$ is reverse biased and therefore both transistors $Q_4$ and $Q_5$ are in a nonconducting state. When the voltage across capacitor 54 becomes great enough for the emitter-base junction of the transistor $Q_4$ to be forward biased, current will flow in the emitter-collector path of transistor $Q_4$ and into the base of the transistor $Q_5$. As a consequence, the transistor $Q_5$ will be forward biased so as to initiate current in the collector-emitter path thereof. The collector current of the transistor $Q_5$ will shift the reference potential applied to tap 60 downwardly to thereby make the base of transistor $Q_4$ more negative to further forward bias transistor $Q_4$. In other words, when the voltage across the capacitor 54 exceeds a certain level, the transistor $Q_4$ will be forward biased and will as a consequence, forward bias transistor $Q_5$ which will regeneratively cause transistor $Q_4$ to be even more forward biased. This regenerative action causes both transistors $Q_4$ and $Q_5$ to become highly conductive very rapidly. The voltage drop across resistor 56 provides collector voltage for the transistor $Q_4$ during heavy conduction to thereby help discharge capacitor 54 more rapidly.

As soon as the voltage across capacitor 54 becomes low enough so the emitter-base junction of transistor $Q_4$ is not heavily forward biased, the base current for the transistor $Q_5$ will be reduced to allow the reference potential applied to tap 60, and consequently the base of transistor $Q_4$, to begin to rise to return to its quiescent condition. As a consequence, both transistors $Q_4$ and $Q_5$ are cut off in a regenerative manner because the rising potential of tap 60 tends to reverse bias the transistor $Q_4$ to thereby entirely terminate conduction therethrough. Thus, the capacitor 54 will again begin to charge.

It is pointed out that the current in the emitter-collector path of transistor $Q_3$ is limited by two extremes. That is, if the current is too small, shunt leakages will prevent capacitor 54 from charging to a sufficiently high voltage to forward bias the transistor $Q_4$. On the other hand, if the current is too great, the transistors $Q_4$ and $Q_5$ will remain forward biased once conduction is initiated therein. Of course, the current normally driven through the emitter-collector path of transistor $Q_3$ corresponds to the center frequency at which the oscillator is designed to operate.

For the first level of illustrated input signal 70 applied to input terminal 10, a relatively high current will be conducted through transistor $Q_2$, and as a consequence a relatively low current through transistor $Q_3$. Thus, the capacitor 54 will be charged at a relatively slow rate and accordingly, relatively few output pulses will be generated between time $t_0$ and time $t_1$. On the other hand, when the level of the input signal rises to the second level between time $t_1$ and time $t_2$, a significantly greater current will be driven through transistor $Q_3$ and capacitor 54. As a consequence, a greater number of pulses will be generated at the output terminal 22 between time $t_1$ and time $t_2$. The third level of the signal applied to input terminal 10 between time $t_2$ and time $t_3$ is intermediate the previously applied levels and accordingly the frequency of the output signal between times $t_2$ and $t_3$ will be intermediate that of the previously generated frequencies.

If desired, a sawtooth waveform, corresponding in frequency to the square waveform available at the output terminal 22, can be derived at the emitter of transistor $Q_4$. It is pointed out that although the frequency of both the sawtooth and the square waveforms vary in the different time periods illustrated, the amplitude of each of the pulses is uniform.

From the foregoing, it should be appreciated that a variable frequency oscillator has been disclosed herein which permits the frequency of an output signal to be varied proportional to changes in amplitude of an applied input signal. More particularly, extremely simple circuits have been disclosed herein for performing this function, such circuits utilizing very few interdependent elements and being characterized by being able to linearly operate over extremely wide ranges. Moreover, inasmuch as the range over which a circuit constructed in accordance with the present teachings can be operated is determined by the capacitor and the current source reference voltage, the operating range of such a circuit can be changed merely by changing the value of the capacitors or reference voltages utilized.

In addition to the aforementioned features of the invention, it is further pointed out that the frequency determining element of the circuits, that is, the capacitor, is not affected by any load connected to output terminal 22.

Still further, it is again pointed out that the circuits disclosed are unsymmetrical, i.e. they do not employ matched circuit halves, as is typical of most prior art circuits. Where such matched halves are utilized, considerable difficulty is sometimes encountered when power is applied to the circuit because conduction is initiated in both halves and as a consequence the circuit fails to oscillate. In order to overcome this difficulty, conventional oscillators are often provided with special means for assuring starting. The invention herein obviates any requirement for such means by providing a considerably simpler oscillator which is provided with what may be considered a self-starting feature.

What is claimed is:

1. A variable frequency oscillator responsive to changes in an input voltage level for linearly changing its frequency of oscillation comprising a first transistor having its emitter-collector path connected in series with a first imepdance; a source of potential for driving current through said first transistor emitter-collector path; a second transistor having its emitter-collector path connected in series with a capacitor and said first impedance and said source of potential; means connecting the base of said second transistor to a source of reference potential; means applying said voltage input to the base of said first transistor whereby changes in said voltage input cause current variations in the emitter-collector path of said first transistor and consequently current variations in the emitter-collector path of said second transistor; and threshold establishing means connected to said capacitor for initiating the discharging of said capacitor when the voltage across said capacitor exceeds a first threshold level and for terminating the discharging of said capacitor when the voltage across said capacitor falls below a second threshold level.

2. A variable frequency oscillator responsive to changes in an input voltage level for linearly changing its frequency of oscillation comprising a first transistor having its emitter-collector path connected in series with a first impedance; a source of potential for driving current through said first transistor emitter-collector path; a second transistor having its emitter-collector path connected in series with a capacitor and said first impedance and said source of potential; means connecting the base of said second transistor to a source of reference potential; means applying said voltage input to the base of said first transistor whereby changes in said voltage input cause current variations in the emitter-collector path of said first transistor and consequently current variations in the emitter-collector path of said second transistor; and threshold establishing means connected to said capacitor for initiating the discharging of said capacitor when the voltage across said capacitor exceeds a first threshold level and for terminating the discharging of said capacitor when the voltage across said capacitor falls below a second threshold level; said threshold establishing means including complementary third and fourth transistors, said third transistor having its collector connected to the base of said fourth transistor; means coupling the base of said third transistor to the collector of said fourth transistor; and means connecting the emitters of said third and fourth transistors respectively to opposite sides of said capacitor

References Cited by the Examiner

UNITED STATES PATENTS

| | | | |
|---|---|---|---|
| 2,129,036 | 9/1938 | Schlesinger | 331—129 X |
| 2,829,257 | 4/1958 | Root | 331—11 |
| 2,864,062 | 12/1958 | Schaffner | 331—111 X |
| 3,060,388 | 10/1962 | Ball et al. | 331—111 X |

ROY LAKE, *Primary Examiner.*